US006801465B2

(12) United States Patent
Somasekhar et al.

(10) Patent No.: US 6,801,465 B2
(45) Date of Patent: Oct. 5, 2004

(54) APPARATUS AND METHOD FOR A MEMORY STORAGE CELL LEAKAGE CANCELLATION SCHEME

(75) Inventors: Dinesh Somasekhar, Hillsboro, OR (US); Yibin Ye, Hillsboro, OR (US); Fatih Hamzaoglu, Charlottesville, VA (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/461,293

(22) Filed: Jun. 13, 2003

(65) Prior Publication Data

US 2003/0206468 A1 Nov. 6, 2003

Related U.S. Application Data

(62) Division of application No. 09/823,575, filed on Mar. 30, 2001.

(51) Int. Cl.[7] .................................................. G11C 7/00
(52) U.S. Cl. ....................... 365/203; 365/196; 365/207; 365/185.25
(58) Field of Search ................................ 365/203, 196, 365/207, 185.25

(56) References Cited

U.S. PATENT DOCUMENTS

| | | | |
|---|---|---|---|
| 4,730,279 A | | 3/1988 | Ohtani |
| 5,583,821 A | * | 12/1996 | Rose et al. ................. 365/226 |
| 6,049,492 A | | 4/2000 | Vogelsang et al. |
| 6,067,253 A | | 5/2000 | Gotou |
| 6,078,523 A | | 6/2000 | Pascucci |
| 6,118,713 A | * | 9/2000 | Raad .......................... 365/201 |
| 6,128,225 A | | 10/2000 | Campardo et al. |
| 6,259,623 B1 | | 7/2001 | Takahashi |
| 6,266,292 B1 | | 7/2001 | Tsern et al. |
| 6,288,949 B1 | | 9/2001 | Hidaka et al. |
| 6,353,569 B1 | | 3/2002 | Mizuno et al. |
| 6,373,745 B2 | | 4/2002 | Saito et al. |
| 2001/0007537 A1 | | 7/2001 | Kenichi et al |
| 2002/0075729 A1 | | 6/2002 | Choi |

FOREIGN PATENT DOCUMENTS

| | | |
|---|---|---|
| GB | 2 256 297 A | 2/1992 |
| JP | 2001 006370 A | 1/2001 |

OTHER PUBLICATIONS

Ken'ichi Agawa, Hiroyuki Hara, Toshinari Takayanagi, and Tadahiro Kuroda, A Bit–LineLeakage Compensation Scheme for Low–Voltage Srams, System ULSI Engineering Laboratory, Toshiba Corporation, 2000 Synposium on VLSI Circuits Digest of Technical Papers, pp. 70–71.

\* cited by examiner

*Primary Examiner*—Connie C. Yoha
(74) *Attorney, Agent, or Firm*—Blakely, Sokoloff, Taylor & Zafman LLP

(57) ABSTRACT

An apparatus is described having a plurality of storage cells coupled between a first bit line and a second bit line. The apparatus also has a first transistor that pre-charges the first bit line and provides a first supply of current for one or more leakage currents drawn from the first bit line by any of the plurality of storage cells. The apparatus also has a second transistor that pre-charges the second bit line and provides a second supply of current for one or more leakage currents drawn from the second bit line by any of the plurality of storage cells.

41 Claims, 4 Drawing Sheets

APPARATUS AND METHOD FOR A MEMORY STORAGE CELL LEAKAGE CANCELLATION SCHEME

The present patent application is a Divisional of application Ser. No. 09/823,575, filed Mar. 30, 2001.

FIELD OF INVENTION

The field of invention relates to semiconductor memory technology generally; and more specifically, to an apparatus and method for a memory storage cell leakage cancellation scheme.

BACKGROUND

FIG. 1 shows a prior art Random Access Memory (RAM) cell 100. The prior art RAM cell 100 of FIG. 1 includes a plurality of "N" storage cells $S_1$ through $S_N$ (each of which may correspond to static RAM (SRAM) cells). Each of the storage cells $S_1$ through $S_N$ stores a bit of data. Data is read from a particular storage cell by activating its corresponding word line (WL) (e.g., $WL_1$ for storage cell $S_1$, $WL_2$ for $S_2$, etc.). During a typical storage cell read operation, the bit lines 101, 102 are pre-charged to a "high" voltage.

The word line of the storage cell to be read (e.g., word line $WL_1$ for storage cell $S_1$) is activated (e.g., with a "high" voltage) while the word lines for the remaining "un read" storage cells (e.g., word lines $WL_2$ through $WL_N$ for storage cells $S_2$ through $S_N$, respectively) are deactivated (e.g., with a "low" voltage). Upon the activation of the word line for the storage cell to be read (e.g., word line $WL_1$ for storage cell $S_1$), the storage cell to be read drives one of the bit lines to a "low" voltage.

For example, if the data stored in storage cell $S_1$ corresponds to a "1", storage cell $S_1$ drives bit line 102 to a "low" voltage while bit line 101 remains at the pre-charged "high" voltage. By contrast, if the data stored in storage cell $S_1$ corresponds to a "0", storage cell $S_1$ drives bit line 101 to a "low" voltage while bit line 102 remains at the pre-charged "high" voltage. FIG. 1 shows an example of the later case (i.e., storage cell $S_1$ has a "0" stored) because drive current Isc is observed being driven from bit line 101 by storage cell $S_1$.

Because the voltages on the bit lines 101, 102 during a storage cell read are different (i.e., one voltage being high, the other voltage being low), a differential signal may be said to exist on the bit lines 101, 102. The differential signal provided on the bit lines 101, 102 may be expressed as:

$$Signal = V1 - V2 \qquad \text{Eqn. 1}$$

where V1 is the voltage on bit line 101 and V2 is the voltage on bit line 102. Note that the actual high and low voltages on the bit lines may vary from embodiment to embodiment. Furthermore, note that the greater the difference between V1 and V2, the greater the differential signal observed on the bit lines 101, 102.

Storage cell leakage may cause an increase in the amount of time it takes the differential voltage to develop on the bit lines 101, 102 during a bit cell read. As such, the speed of operation of the RAM cell 100 may be adversely affected by the storage cell leakage. The rate at which the differential voltage is created during the course of a storage cell read, without storage cell leakage, may be expressed as:

$$Dv/Dt = Isc/(Cb + 2Cc) \qquad \text{Eqn. 2}$$

where: 1) Cb is the capacitance of the bit line being pulled down; 2) Cc is the capacitance between the bit lines 101, 102; and 3) Isc is the amount of drive current pulled by a storage cell being read from.

From Equation 2, it is apparent that the rate at which the differential voltage is created increases as Isc increases. Storage cell leakage has the effect of the reducing the Isc term in Equation 2 and, as such, reduces the rate at which the differential voltage is created. Storage cell leakage is the tendency of a storage cell, that is not being read from, to pull current from a bit line. As the number of "un-read" cells that pull leakage current from the "high" bit line increases, the impact on the rate at which the differential voltage worsens.

A worse case condition is exemplified in FIG. 1. Specifically, during a read of storage cell $S_1$ which pulls current Isc from the low bit line 101, each of the remaining N−1 storage cells (i.e., storage cells $S_2$ through $S_N$) pull leakage current $I_L$ from the high bit line 102. Each leakage current $I_L$ from the high bit line 102 will cause a drop in the high bit line 102 voltage. As such, N−1 leakage currents $I_L$ from the high bit line 102 (as seen in FIG. 1) corresponds to a worst case voltage drop on the high bit line 102.

From the perspective of the differential voltage being established between the pair of bit lines 101 and 102, as the high bit line 102 voltage drops from the N−1 leakage currents $I_L$, the effect of dropping the low bit line 101 voltage with the drive current Isc is reduced. This corresponds to a decrease in the differential signal voltage which corresponds to a decrease in the rate at which the differential signal voltage is developed.

That is, for the worst case condition shown in FIG. 1, the rate at which the differential voltage is created during the course of a storage cell read, with storage cell leakage, may be expressed as:

$$Dv/Dt = (Isc - (N-1)I_L)/(Cb + 2Cc) \qquad \text{Eqn. 3}$$

where: 1) Cb is the capacitance of the bit line being pulled down; 2) Cc is the capacitance between the bit lines 101, 102; 3) Isc is the amount of drive current pulled by a storage cell being read from; and 4) $(N-1)I_L$ is the total amount of leakage current being pulled from the high bit line 102. As seen in Equation 3, the leakage current term $(N-1)IL$ subtracts from the drive current term Isc. This corresponds to a drop in the rate at which the differential voltage is developed. As discussed, this corresponds to a drop in the speed of the RAM cell 100.

BRIEF DESCRIPTION OF DRAWINGS

The present invention is illustrated by way of example, and not limitation, in the figures of the accompanying drawings in which like references indicate similar elements and in which.

DETAILED DESCRIPTION

Figure 1:
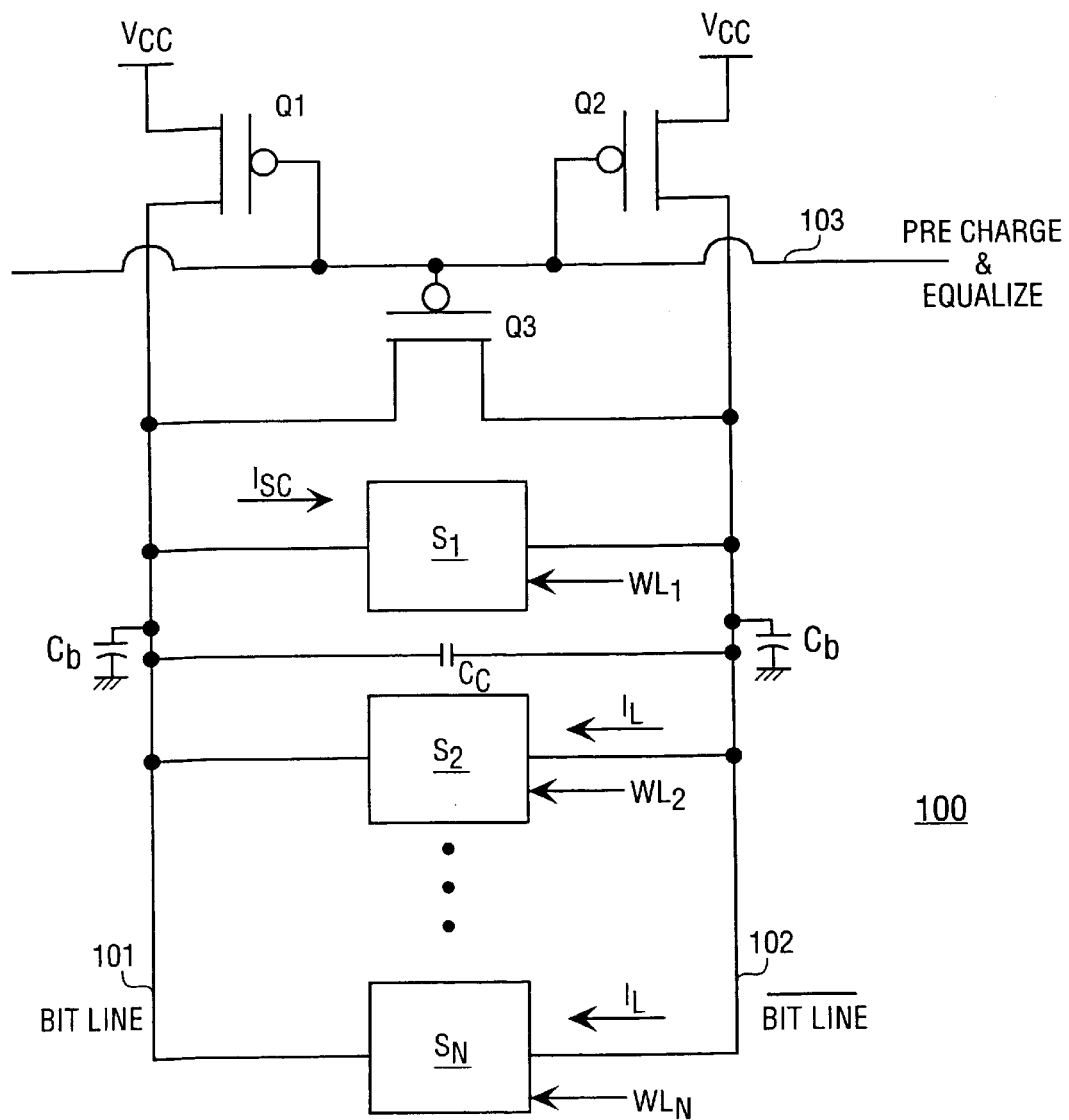
FIG. 1 shows a prior art RAM cell.
Figure 2:
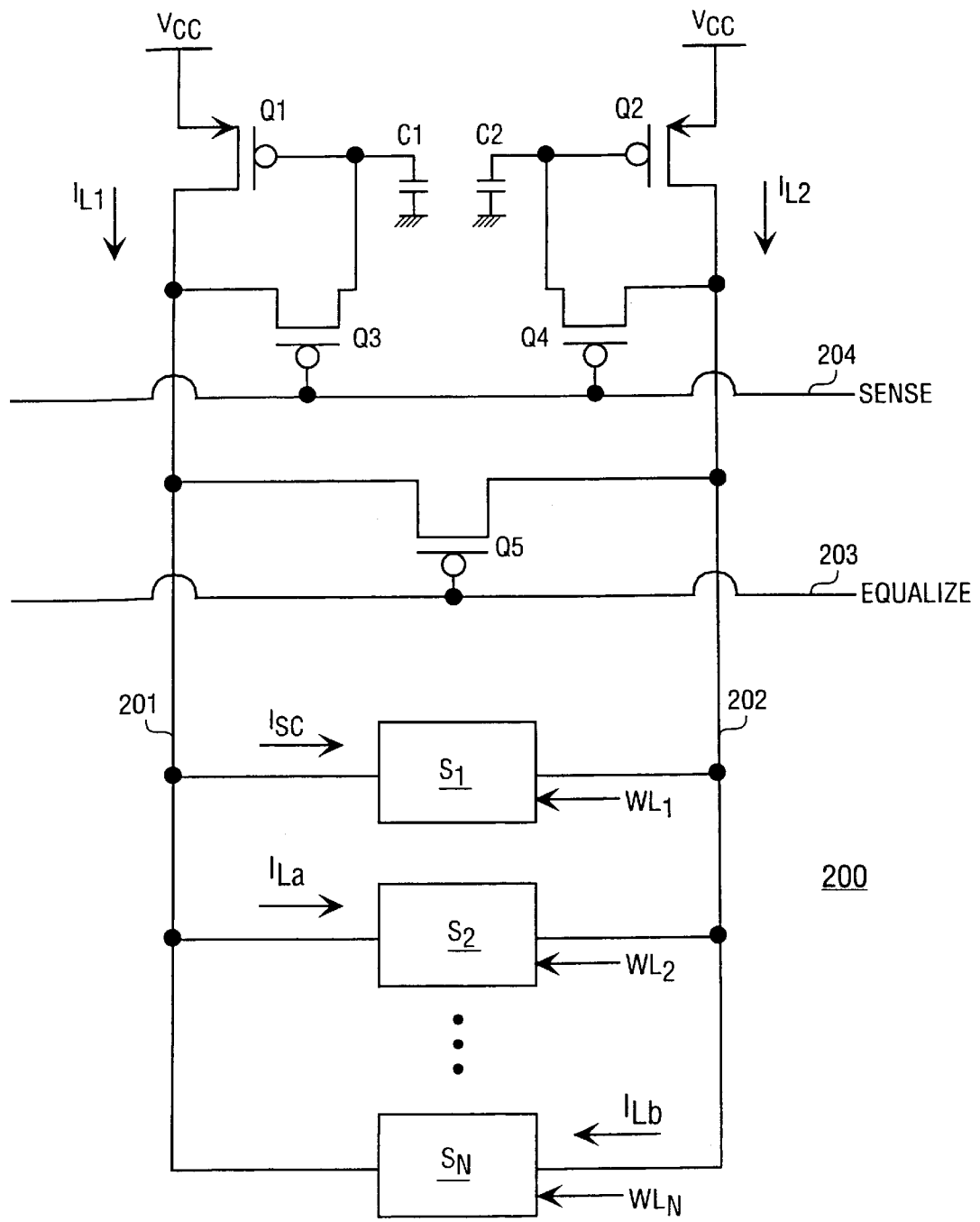
FIG. 2 shows an embodiment of an improved RAM cell.
Figure 3:
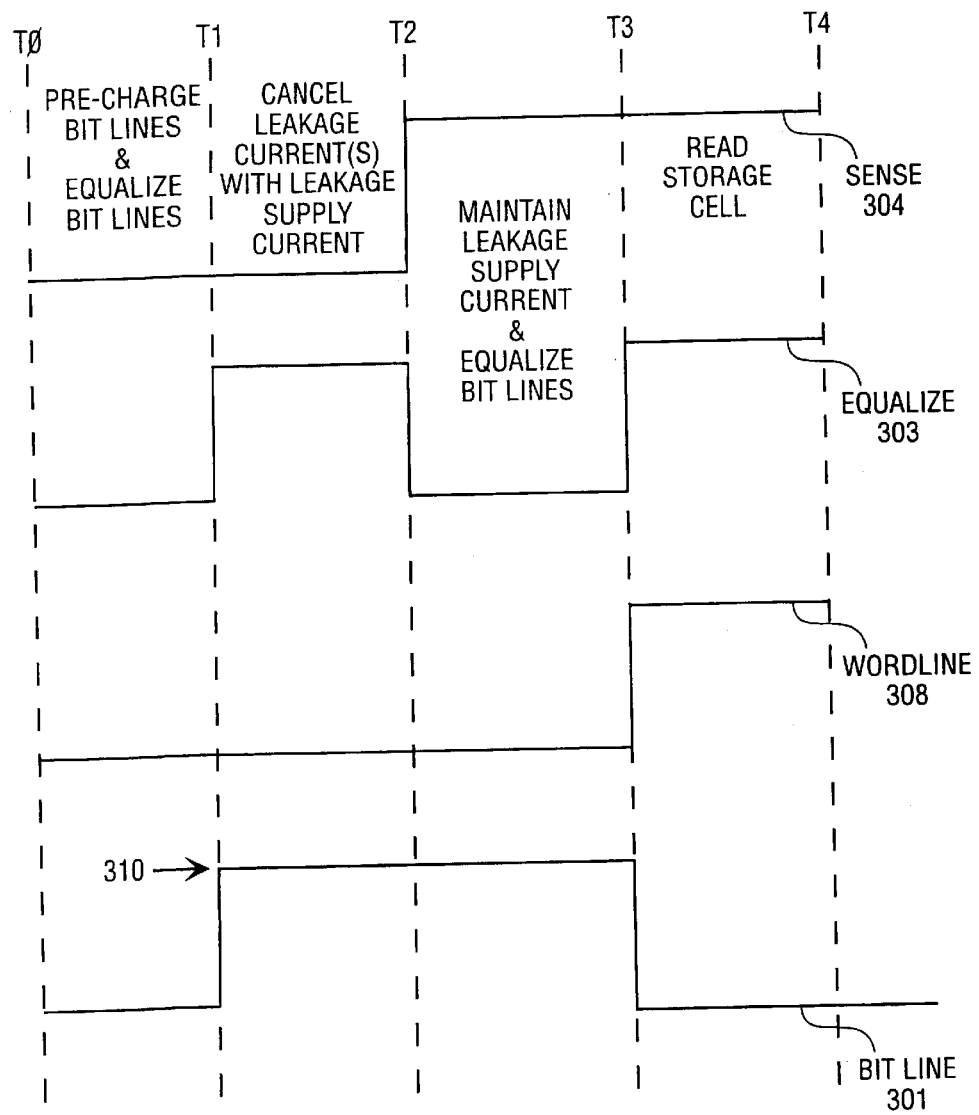
FIG. 3 shows an embodiment of control line signaling that may be used to read data from a storage cell within the improved RAM cell of FIG. 2.

Providing cancellation current on the bit lines effectively nullifies the reduced differential signal quality described above in the background. FIG. 2 shows an embodiment 200 of an improved RAM cell that effectively cancels the leakage current. FIG. 3 shows an embodiment of control signaling that may be used to read the from a storage cell within the improved RAM cell 200 of FIG. 2.

Referring to FIGS. 2 and 3, the read operation of a storage cell may be viewed as occurring in phases. A first phase (e.g., between times T0 and T1 of FIG. 3) equalizes and precharges the bit lines 201, 202. A second phase (e.g., between times T1 and T2 of FIG. 3) approximately cancels the effect of any leakage current that may exist on the bit lines 201, 202 by providing a leakage; supply current $I_{L1}$, $I_{L2}$ on each bit line 201, 202 individually. A third phase (e.g., between times T2 and T3) maintians the leakage supply currents $I_{L1}$, $I_{L2}$ while the bit lines 201, 202 are equalized again. A fourth phase (e.g., between times T3 and T4) reads data from a storage cell.

A first phase (e.g., between times T0 and T1 in FIG. 3) equalizes and precharges the bit lines 201, 202. The bit lines 201, 202 are equalized by turning transistor Q5 on. Transistor Q5 is turned on by driving the equalize line 203, 303 low. Turning transistor Q5 on effectively creates a short circuit between the bit lines 201, 202 which causes the bit lines 201, 202 to have an approximately equal voltage. This activity may be referred to as equalizing the bit lines 201, 202.

Equalizing the bit lines 201, 202 helps to effectively "clear" the RAM cell 200 of a prior storage cell reading. For example if a storage cell was read from prior to time T0 in FIG. 3, the bit lines 201, 202 may still maintain the differential voltage from the reading. That is, one bit line may be at a low voltage while another bit line may be at a high voltage. Driving the equalize line 203 low allows the bit lines 201, 202 to reach a common voltage.

The bit lines 201, 202 are also pre-charged when the sense line 204, 304 is driven low. In the embodiment of FIG. 2, pre-charging the bit lines 201, 202 corresponds to bringing both the bit lines 201, 202 to a high voltage. During a subsequent read from a storage cell (e.g., between times T3 and T4 of FIG. 4), the storage cell being read from pulls one of the pre-charged bit lines to a low voltage.

In the embodiment of FIG. 2, the bit lines 201, 202 are pre-charged by turning transistors Q1 and Q2 on. Transistor's Q1 and Q2 are turned on in the embodiment of FIG. 2 by driving the sense line low 204, 304. Note that, in the particular embodiment of FIG. 2, the gate and drains of each of transistors Q1 and Q2 may be "shorted" by a transistor. That is, transistor Q3 shorts the drain and gate of transistor Q1 and transistor Q4 shorts the drain and gate of transistor Q2. Shorting the gate and drain of each of transistors Q1 and Q2 configures these transistors Q1, Q2 as an active load.

That is, driving the sense line 204, 304 low turns on transistors Q3 and Q4 which, in turn, respectively enables transistors Q1 and Q2 as active loads. The source to drain voltage $V_{SD}$ of an active load may be approximated as:

$$V_{SD}=V_{SG}=V_T+(I_{SD}/B)^{0.5} \qquad \text{Eqn. 4}$$

where: 1) $V_{SG}$ is the source to gate voltage; 2) $V_T$ is the threshold voltage; 3) $I_{SD}$ is the source to drain current; and 3) B is the transconductance. For small source to drain currents $I_{SD}$, note that the source to drain voltage $V_{SD}$ approaches $V_T$. As such, in the embodiment of FIG. 2, the pre-charge voltage on the bit lines 201, 202 may typically correspond to a voltage near Vcc−$V_T$. FIG. 3 shows an exemplary pre-charged bit line level 310 for the voltage 301 on bit line 201 of FIG. 2.

In an alternate embodiment (in order to speed the rate at which the bit lines are pre-charged), the gate voltages of Q1 and Q2 may be forcibly driven low while transistors Q3 and Q4 are kept off during the first phase between times T0 and T1. For example, between times T0 and T1, the sense voltage may be placed at a high voltage (which turns off transistors Q3 and Q4) and the gate voltages of transistors Q1 and Q2 may be grounded.

This places transistors Q1 and Q2 in a "high current" output state which allows them to drive the capacitance associated with bit lines 201, 201. This allows the bit line 201, 202 voltages to approach their pre-charge voltage faster than a pure active load. As such, referring to FIG. 3, the sense line 204 voltage 304 may be, in one embodiment: 1) at a high logic level between times T0 and T1; and 2) switched to a low logic level at time T1.

The equalization between times T0 and T1 may also be eliminated because the establishment of equal pre-charge voltages on the bit lines 201, 202 is not necessary between times T0 and T1. That is, the act of pre-charging the bit lines 201, 202 effectively clears them of their most recent storage cell read information. In another alternate embodiment, transistors Q3 and Q4 may be replaced with transmission gates to protect against low bit line 201, 202 voltages. A transmission gate is a parallel coupling of an NMOS transistor and a PMOS transistor such that when one is "on", both are "on" and when one is "off" both are "off".

During a second phase (e.g., between times T1 and T2 in FIG. 3) the effect of any leakage current that may exist on the bit lines 201, 202 is approximately canceled by providing a leakage supply current $I_{L1}$, $I_{L2}$ on each bit line 201, 202 individually. This is accomplished by deactivating the equalization between the bit lines 201, 202. In the embodiment of FIG. 2, deactivating the equalization between the bit lines 201, 202 is accomplished by turning off transistor Q5 which, in turn, is accomplished by driving the equalization line 203, 303 high.

With the equalization deactivated, the bit lines 201, 202 are isolated from one another. As such, transistors Q1 and Q2 individually supply the leakage current that may exist on their respective bit lines 201, 202. That is, transistor Q1 provides a current $I_{L1}$ which supplies any leakage currents that flow from bit line 201 (such as leakage current $I_{La}$). Transistor Q2 provides a current $I_{L2}$ which supplies any leakage currents that flow from bit line 202 (such as leakage current $I_{Lb}$).

If X storage cells in the RAM cell 200 leak from bit line 201 and Y storage cells in the RAM cell 200 leak from bit line 202, then (assuming for simplicity each leakage into a storage cell corresponds to the same amount of leakage current $I_L$) $I_{L1}=XI_L$ and $I_{L2}=YI_L$. As discussed in more detail below, individually supplying the leakage currents on each bit line 201, 202, approximately cancels their effect on the differential signal established between the bit lines 201, 202 during a read operation of a storage cell.

Note that, in light of Equation 4, the source to gate voltages of transistors Q1 and Q2 may differ if $I_{L1}$ does not equal $I_{L2}$. Given that the gate to source voltages of transistors Q1 and Q2 may differ if $I_{L1}$ does not equal $I_{L2}$, note that (again in light of Equation 4) the voltage on the bit lines 201, 202 may differ as a consequence. That is, as an active load is configured to have $V_{SG}=V_{SD}$, a difference in source to gate voltage corresponds to a difference in source to drain voltage. This will result in different voltages as between the pair of bit lines 201, 202.

During a third phase (e.g., between times T2 and T3 of FIG. 3) the bit lines 201, 202 are equalized while the leakage supply currents $I_{L1}$, $I_{L2}$ are maintained. The equalization to the RAM cell 200 (which is accomplished in the embodiments of FIGS. 2 and 3 by dropping the voltage on the equalize line 203, 303 to a low voltage) "fixes" the difference in voltage, as between the pair of bit lines 201, 202, that may develop as a result of separately supplying their corresponding leakage currents (as just described above).

As such, should a difference in voltage develop on the bit lines 201, 202, the equalization will force the bit line 201, 202 voltages to be approximately equal. The leakage supply currents $I_{L1}$, $I_{L2}$ are also maintained by turning transistors Q3 and Q4 off (which is accomplished in the embodiments of FIGS. 2 and 3 by raising the sense line 204, 304 to a high voltage). Turning off transistors Q3 and Q4 removes the short circuit that exists between gate and source of transistors Q1 and Q2.

However, due to the presence of capacitors C1 and C2, the leakage supply currents $I_{L1}$, $I_{L2}$ (that respectively run through transistors Q1 and Q2) remain substantially unchanged. As such, the leakage supply currents may be said to be "maintained". Recall that a difference in bit line 201, 202 voltage may develop as a result of separately supplying the leakage currents for each bit line (between times T1 and T2 as seen in FIG. 3). As discussed, the gate voltages for Q1 and Q2 may differ as a consequence.

During the generation of the leakage supply currents $I_{L1}$, $I_{L2}$ (between times T1 and T2 as seen in FIG. 3) the voltage on capacitors C1, C2 will respectively "ramp up" to the voltage on their respective bit line (because of the short circuit established by transistors Q3 and Q4). That is, capacitor C1 ramps up to the voltage maintained on bit line 201 and capacitor C2 ramps up to the voltage maintained on bit line 202. Again, this is consistent with $V_{SD}=V_{SG}$ for each transistor Q1 and Q2 when transistors Q3 and Q4 are on.

When transistors Q3 and Q4 are turned off (between times T2 and T3 as seen in FIG. 3), both capacitors C1, C2 "hold onto" their voltage. As such, the leakage supply currents $I_{L1}$, $I_{L2}$ continue to be generated from transistors Q1 and Q2 respectively. This corresponds to the leakage supply currents $I_{L1}$, $I_{L2}$ being "maintained" as discussed above. When transistor Q5 is turned on (as seen in FIG. 3 between times T2 and T3) bit lines 201, 202 begin to be equalized. After a steady state is reached, the bit lines 201, 202 have approximately equal voltage and the leakage supply currents $I_{L1}$, $I_{L2}$ continue to be generated from transistors Q1 and Q2 respectively.

In a fourth phase (e.g., between times T3 and T4 as seen in FIG. 3), the data is read from a particular storage cell. As such, in order to read the data from the storage cell, the equalization of the bit lines 201, 202 is terminated so that a differential voltage is allowed to develop across the bit lines. Note, therefore, that FIG. 3 indicates the voltage 303 on the equalization line 203 is raised so that transistor Q5 is turned off.

In the exemplary embodiment of FIG. 2, storage cell $S_1$ is being read from (e.g., by activating 308 its corresponding word line $WL_1$) and contains digital information corresponding to a "0". As such, storage cell $S_1$ pulls drive current Isc from bit line 201 which pulls down the voltage 301 on bit line 201. As each of the leakage currents have been accounted for with the leakage supply currents $I_{L1}$, $I_{L2}$ that are being provided by transistors Q1 and Q2, the differential voltage across the bit lines develops about as fast as the "full rate" as originally provided by Equation 2.

Figure 4:
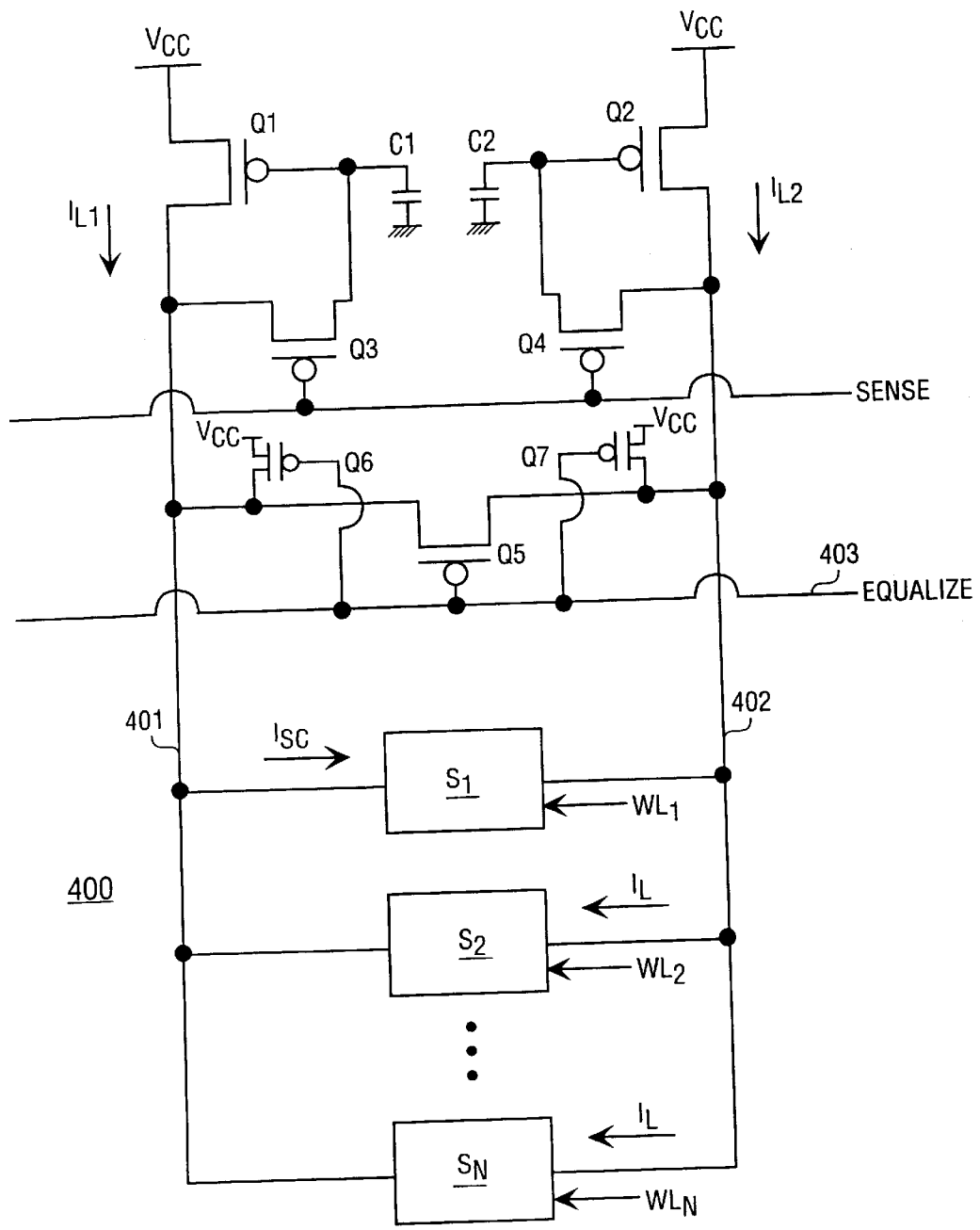
FIG. 4 shows another embodiment of an improved RAM cell.

FIG. 4 shows an alternate embodiment that improves the speed at which the bit lines 401, 402 are pre-charged. The embodiment 400 of FIG. 4 adds transistors Q6 and Q7 to the embodiment 200 of FIG. 2. Transistors Q6 and Q7 further speed up may be used to further speed up the bit line pre-charge activity that occurs between times T0 and T1 of FIG. 3 (and/or between times T2 and T3 of FIG. 3). Whenever the equalize line 403 voltage 303 drops to a low voltage, transistors Q6 and Q7 are "on" which effectively drives the capacitance of the bit lines 401, 402 resulting in the rapid increase of the bit line 401, 402 voltages.

The designs and approaches described above may be utilized within a memory device such as a semciconductor memory chip. The semiconductor chip may then be implemented in a system such as computing system or a networking system. For example, the memory device may be coupled to: 1) a general purpose processor; or 2) a digital signal processor or custom logic circuit (e.g., an Application Specific Integrated Circuit (ASIC); or 3) a bus structure (e.g., a PCI bus). In other applications the designs and approaches discussed above may be used in embedded memory applications. In embedded memory applications, a region of memory is constructed within a larger semiconductor chip (e.g., as an "on board" cache or as memory resources within a system on chip (SoC)).

Note also that embodiments of the present description may be implemented not only within a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behaviorial level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A random access memory, comprising:
    a) a plurality of storage cells;
    b) a first bit line and a second bit line coupled to each of said plurality of storage cells, said first and second bit lines designed:
        1) to not be equalized while said first bit line receives a first supply current and while said second bit line receives a second supply current, said first supply current supplying leakage current drawn from said first bit line by one or more of said storage cells, said second supply current supplying leakage current drawn by one or more of said storage cells;

2) to be equalized to help prepare said first and second bit lines for a read of one of said storage cells, said first bit line receiving said first supply current and said second bit line receiving said second supply current while said first and second bit lines are said equalized; and 3) to develop a differential signal while one of said storage cells is being read, said first bit line receiving said first supply current and said second bit line receiving said second supply current while said first and second bit lines are said developing a differential signal.

2. The random access memory of claim 1 wherein said random access memory is a static random access memory.

3. The random access memory of claim 2 wherein said first and second bit lines are designed to be pre-charged to help prepare said first and second bit lines for a read of one of said storage cells, said first and second bit lines being pre-charged prior to their said not being equalized.

4. The random access memory of claim 2 wherein said first and second bit lines are designed to be pre-charged while they are being said equalized.

5. The random access memory of claim 2 further comprising an equalize signal line and a sense signal line, wherein, an equalize signal on said equalize signal line can equalize said first and second bit lines, and a sense signal on said sense signal line allows said first and second bit lines to develop a differential signal.

6. The random access memory of claim 2 wherein said first and second bit lines are designed to be pre-charged to help prepare said first and second bit lines for a read of one of said storage cells, said first and second bit lines being pre-charged prior to their said not being equalized.

7. The random access memory of claim 2 further comprising a first transistor that provides said first supply current to said first bit line, and, a second transistor that provides said second supply current to said second bit line, said first transistor coupled to a first capacitor that holds a first voltage to force said first transistor to supply said first supply current while said first and second bit lines are said equalized and said developing a differential signal, said second transistor coupled to a second capacitor that holds a second voltage to force said second transistor to supply said second supply current while said first and second bit lines are said equalized and said developing a differential signal.

8. The random access memory of claim 2 wherein said random access memory is coupled to a processor.

9. The random access memory of claim 7 wherein said processor is a general purpose processor.

10. The random access memory of claim 8 wherein said processor is a digital signal processor.

11. The random access memory of claim 1 wherein said first and second bit lines are designed to be pre-charged to help prepare said first and second bit lines for a read of one of said storage cells, said first and second bit lines being pre-charged prior to their said not being equalized.

12. The random access memory of claim 1 wherein said first and second bit lines are designed to be pre-charged while they are being said equalized.

13. The random access memory of claim 1 further comprising an equalize signal line and a sense signal line, wherein, an equalize signal on said equalize signal line can equalize said first and second bit lines, and a sense signal on said sense signal line allows said first and second bit lines to develop a differential signal.

14. The random access memory of claim 1 wherein said first and second bit lines are designed to be pre-charged to help prepare said first and second bit lines for a read of one of said storage cells, said first and second bit lines being pre-charged prior to their said not being equalized.

15. The random access memory of claim 1 further comprising a first transistor that provides said first supply current to said first bit line, and, a second transistor that provides said second supply current to said second bit line, said first transistor coupled to a first capacitor that holds a first voltage to force said first transistor to supply said first supply current while said first and second bit lines are said equalized and said developing a differential signal, said second transistor coupled to a second capacitor that holds a second voltage to force said second transistor to supply said second supply current while said first and second bit lines are said equalized and said developing a differential signal.

16. The random access memory of claim 1 wherein said random access memory is coupled to a processor.

17. The random access memory of claim 1 wherein said processor is a general purpose processor.

18. The random access memory of claim 1 wherein said processor is a digital signal processor.

19. A method, comprising:
a) supplying a first supply current to a first bit line to supply leakage current drawn from said first bit line by one or more storage cells that are coupled to said first bit line, and, supplying a second supply current to a second bit line to supply leakage current drawn from said second bit line by one or more storage cells that are coupled to said second bit line, each of said storage cells coupled to said first and second bit lines; and, b) maintaining said first supply current to said first bit line and maintaining said second supply current to said second bit line while said first and second bit lines are equalized in order to prepare said first and second bit lines to represent data stored in a storage cell, said storage cell coupled to said first bit line and said second bit line.

20. The method of claim 19 further comprising maintaining said first supply current to said first bit line and maintaining said second supply current to said second bit line while data is being read from a storage cell that is coupled to said first bit line and said second bit line.

21. The method of claim 20 further comprising developing a differential signal on said first and second bit lines to represent said data is being read.

22. The method of claim 19 further comprising pre-charging said first and second bit lines prior to said supplying.

23. The method of claim 19 further comprising pre-charging said first and second bit lines while said first and second bit lines are being said equalized.

24. A method, comprising:
a) supplying a first supply current to a first bit line to supply leakage current drawn from said first bit line by one or more storage cells that are coupled to said first bit line, and, supplying a second supply current to a second bit line to supply leakage current drawn from said second bit line by one or more storage cells that are coupled to said second bit line, each of said storage cells coupled to said first and second bit lines; and b) maintaining said first supply current to said first bit line and maintaining said second supply current to said second bit line while said first and second bit lines are pre-charged in order to prepare said first and second bit lines to represent data stored in a storage cell, said storage cell coupled to said first bit line and said second bit line.

25. The method of claim 24, further comprising maintaining said first supply current to said first bit line and maintaining said second supply current to said second bit line while data is being read from a storage cell that is coupled to said first bit line and said second bit line.

26. The method of claim 25, further comprising developing a differential signal on said first and second bit lines to represent said data is being read.

27. The method of claim 24 further comprising pre-charging said first and second bit lines prior to said supplying.

28. The method of claim 24 further comprising equalizing said first and second bit lines while said first and second bit lines are being said equalized.

29. A memory, comprising:
   a) a first bit line;
   b) a second bit line;
   c) a plurality of storage cells coupled to said first bit line and said second bit line;
   d) a first transistor coupled to said first bit line to pre-charge said first bit line;
   e) a second transistor coupled to said second bit line to pre-charge said second bit line;
   f) an equalize line to equalize said first and second bit lines; and,
   g) a first capacitor coupled to said first transistor, said first capacitor to maintain a first voltage applied to said first transistor that enables said first transistor to supply leakage current drawn from said first bit line by one or more of said storage cells while said first and second bit lines are equalized; and,
   h) a second capacitor coupled to said second transistor, said second capacitor to maintain a second voltage applied to said second transistor that enables said second transistor to supply leakage current drawn from said second bit line by one or more of said storage cells while said first and second bit lines are equalized.

30. The memory of claim 29 further comprising a third transistor coupled to said first and second bit lines and said equalize line to equalize said first and second bit lines.

31. The memory of claim 30 further comprising a fourth transistor and a fifth transistor, said fourth transistor coupled at different nodes to a supply node, said equalize line and a first node of said third transistor, said fifth transistor coupled at different nodes to said supply node, said equalize line and a second node of said third transistor 32. The memory of claim 29 further comprising a third transistor that straddles said first transistor to cause said first transistor to behave as an active load while said first bit line is being pre-charged, and, a fourth transistor that straddles said second transistor to cause said second transistor to behave as an active load while said first bit line is being pre-charged.

33. The memory of claim 29 wherein said memory is a static random access memory.

34. The memory of claim 29 wherein said memory is coupled to a digital signal processor.

35. The memory of claim 29 wherein said memory is coupled to a general purpose processor.

36. The memory of claim 29 further comprising a bus coupled to said memory.

37. A machine readable medium containing a description of a circuit for a memory, said circuit comprising:
   a) a first bit line;
   b) a second bit line;
   c) a plurality of storage cells coupled to said first bit line and said second bit line;
   d) a first transistor coupled to said first bit line to pre-charge said first bit line;
   e) a second transistor coupled to said second bit line to pre-charge said second bit line;
   f) an equalize line to equalize said first and second bit lines; and,
   g) a first capacitor coupled to said first transistor, said first capacitor to maintain a first voltage applied to said first transistor that enables said first transistor to supply leakage current drawn from said first bit line by one or more of said storage cells while said first and second bit lines are equalized; and,
   h) a second capacitor coupled to said second transistor, said second capacitor to maintain a second voltage applied to said second transistor that enables said second transistor to supply leakage current drawn from said second bit line by one or more of said storage cells while said first and second bit lines are equalized.

38. The machine readable medium of claim 37 wherein said circuit further comprises a third transistor coupled to said first and second bit lines and said equalize line to equalize said first and second bit lines.

39. The machine readable medium of claim 38 wherein said circuit further comprises a fourth transistor and a fifth transistor, said fourth transistor coupled at different nodes to a supply node, said equalize line and a first node of said third transistor, said fifth transistor coupled at different nodes to said supply node, said equalize line and a second node of said third transistor.

40. The machine readable medium of claim 37 wherein said circuit further comprises a third transistor that straddles said first transistor to cause said first transistor to behave as an active load while said first bit line is being pre-charged, and, a fourth transistor that straddles said second transistor to cause said second transistor to behave as an active load while said first bit line is being pre-charged.

41. The machine readable medium of claim 37 wherein said memory is a static random access memory.

* * * * *